(12) United States Patent  (10) Patent No.: US 6,300,200 B1
Chang  (45) Date of Patent: Oct. 9, 2001

(54) DEVICE FABRICATION METHOD FOR A NON-VOLATILE MEMORY DEVICE USED FOR NON-OVERLAPPING IMPLANT

(75) Inventor: Ching-Yu Chang, I Lan Hsien (TW)

(73) Assignee: Macronix International Co., Ltd. (TW)

(*) Notice: Subject to any disclaimer, the term of this patent is extended or adjusted under 35 U.S.C. 154(b) by 0 days.

(21) Appl. No.: 09/750,081

(22) Filed: Dec. 29, 2000

(30) Foreign Application Priority Data

Nov. 7, 2000 (TW) .................................................. 89123520

(51) Int. Cl.$^7$ .............................................. H01L 21/8246

(52) U.S. Cl. ........................................... 438/275; 438/278

(58) Field of Search ...................................... 438/275–278

(56) References Cited

U.S. PATENT DOCUMENTS 5,523,251 * 6/1996 Hong .
5,585,297 * 12/1996 Sheng et al. .

* cited by examiner

*Primary Examiner*—Jey Tsai (57) ABSTRACT

A method of fabricates a non-volatile ROM device on a semiconductor substrate with a plurality of parallel buried bit lines, a gate oxide layer above the substrate and word lines formed above the gate oxide layer comprises: forming a dielectric layer over the word lines and gate oxide layer, forming and pattern first photoresist layer over the dielectric layer, etching the dielectric layer, stripping the first photoresist layer, forming and pattern second photoresist layer over the dielectric layer to develop an opening area for ion implantation, ion implanting a code implant dopant through the opening area down into the substrate and stripping the second photoresist layer.

6 Claims, 7 Drawing Sheets

DEVICE FABRICATION METHOD FOR A NON-VOLATILE MEMORY DEVICE USED FOR NON-OVERLAPPING IMPLANT

FIELD OF THE INVENTION

The present invention relates to semiconductor memory devices and more particularly to a method of fabricating a non-volatile memory device used in a non-overlapping implant.

BACKGROUND OF THE INVENTION

Figure 1:
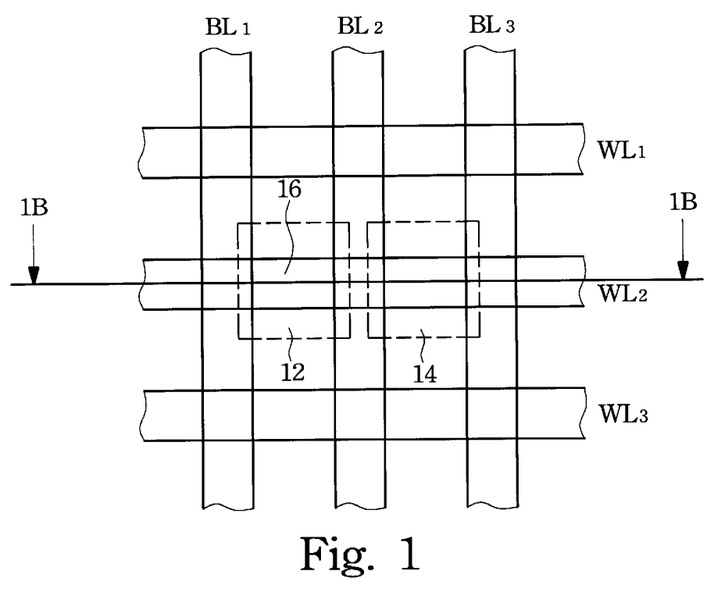
FIG. 1 shows a schematic top view of a conventional ROM device.

FIG. 1 shows a schematic plan view of a conventional MOSFET-based ROM device 10 which is specially designed for permanent storage data. This ROM device includes a plurality of memory cells as exemplarily indicated by the dash boxes labeled with the reference numerals 12, 14, which can be accessed via an array of intercrossed world lines WL1, WL2, WL3 and an array of buried bit lines BL1, BL2, BL3. World lines passe over the tops of the buried bit lines. Each of the memory cells is associated with one segment of the word line between each neighboring pair of the bit lines under which one channel region is formed labeled with the reference numeral 16. Whether the memory cell 12 stores the data 0 or 1 is dependent on whether its associated channel region 16 is doped with impurity or not.

Figure 2:
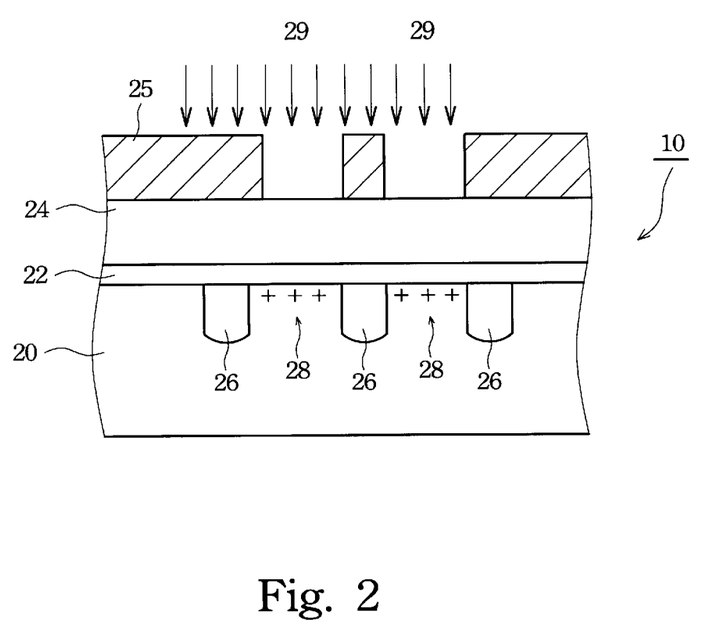
FIG. 2 shows a cross section taken along line 1B—1B in FIG. 1 illustrating the step of implanting.

FIG. 2 shows a cross section of the device 10 taken along line 1B—1B in FIG. 1. Device 10 includes a P-doped silicon substrate 20 with buried N+ bit lines 26. Over the substrate is formed a gate oxide layer 22 upon which is formed a polysilcon world lines 24. Photoresist mask with a pattern 25 is formed over the polysilicon word line 24 for the process of code ion implantation. The section in FIG. 2 shows code implantation of implanted boron ion region 28.

To achieve microminiaturization of integrated circuit devices, individual elements have been made very small and the elements have been closely packed. As read only memory devices scaled down in dimensions, there is a continuous challenge to maintain close spacing between the buried bit lines to obtain density cell structures. Also, the spacing between the bit lines and code implant areas is critical to maintaining consistent bit line resistance that is a important factor to ROM read speed. Code implants and bit lines are composed of an opposite type impurities such that N+ bit lines and P+ code implants or P+ bit lines and N+ code implants. A large bit line resistance due to a code impurity overlap will degrade the data reading speed.

As shown in FIG. 2, conventional photolithography processes are used to form photoresist pattern 25 on the surface, leaving opening area where the code implants are desired. The remaining photoresist pattern 25 is used as a code implant mask. When the bit lines are N+ type regions, a boron ion is normally used for the code implant. The surface is implanted with boron forming code implant region 28.

Figure 3:
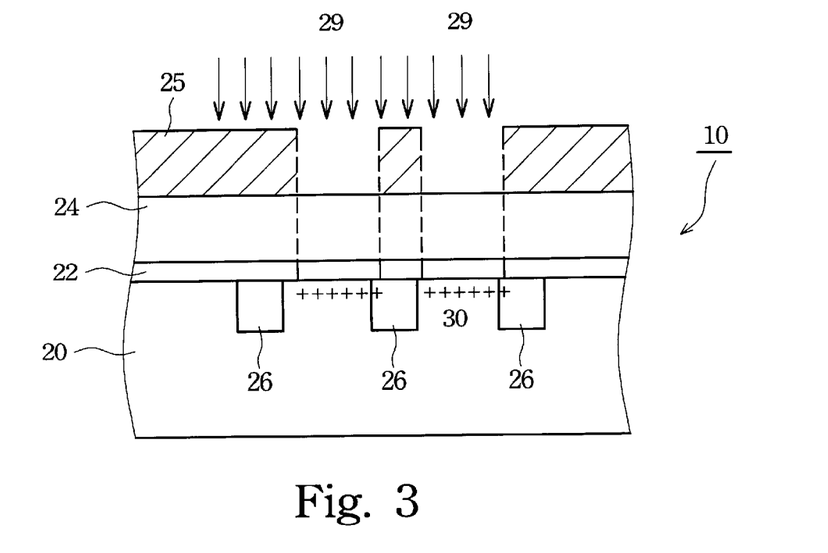
FIG. 3 shows a cross section taken along line 1B—1B in FIG. 1 illustrating the step of implanting.

Referring to FIG. 3, a ROM code implant region is located below an opening area in the photoresist mask 25 at the intersection of the word line and the space between two adjacent bit lines. The section in FIG. 3 shows a code implantation 30 of implanted boron ions 29. The code implantation 30 overlap the buried bit lines 26 due to the mask shift indicated by dash line thereby increasing the bit line resistance due to the opposite type impurity. On the other hand, the most advanced ULSI has a minimum feature size of 0.15 um, which is very close to the resolution limit of optical photolithography because of the light source. The code implantation area is about 0.15 um$^2$ in a 0.15 um process. The light refraction is often introduced to the resolution difference, which may cause the overlap. The photo masks manufacturing therefore need optic proximity correction process. Hence, in a conventional photolithography process, overlay control is very time-consuming to carry out. In addition, to reduce manufacturing cost, the process of masks manufacturing must be relatively simple.

SUMMARY OF THE INVENTION

It is therefore an objective of the present invention to provide a method for fabrication a ROM semiconductor device to overcome the drawback of conventional fabrication method, which adds the step of forming a protective layer before forming photoresist pattern, allowing the overlay control to be simplified.

Another objective of the invention is to provide a process to eliminate the using of a special mask needing optic proximity correction process.

In accordance with the above objectives of the present invention, a new method is provided for fabricating a non-volatile ROM device on a semiconductor substrate with a plurality of parallel buried bit lines, the buried bit lines being oriented in a first direction, a gate oxide layer above the substrate and word lines formed above the gate oxide layer, which comprises theses following steps. A dielectric layer is formed over the word lines and gate oxide layer. A first photoresist layer is formed over the dielectric layer. The first photoresist layer is then selectively exposed to develop first opening area over the photoresist layer, wherein the opening area centered between the adjacent bit lines. The dielectric layer is etched through the first opening area, the first photoresist layer is stripped. A second photoresist layer is formed over the dielectric layer and then selectively exposes the second photoresist layer to develop second opening area over the second photoresist layer to define a pattern of code ion implantation. A code implant dopant implants through the second opening area down into the substrate second opening area, and stripped the second photoresist layer.

BRIEF DESCRIPTION OF THE DRAWINGS

The foregoing aspects and many of the attendant advantages of this invention will become more readily appreciated as the same becomes better understood by reference to the following detailed description, when taken in conjunction with the accompanying drawings, wherein.

DETAILED DESCRIPTION OF THE PREFERRED EMBODIMENT

A preferred embodiment of the method according to the invention is disclosed in the following.

Figure 4:
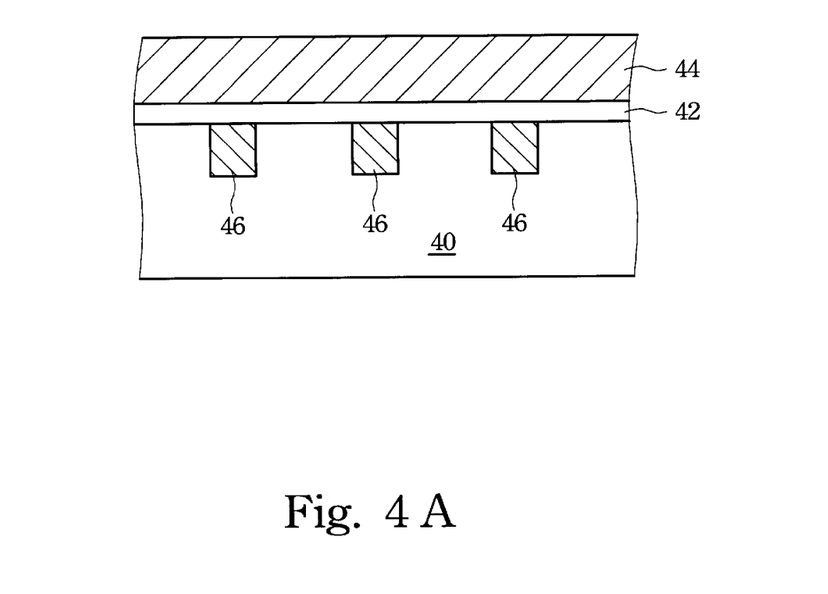
FIG. 4A shows a cross section view of semiconductor substrate illustrating the steps of forming buried lit lines, gate oxide layer and polysilicon layer on the semiconductor substrate according to the present invention.
FIG. 4B shows the perspective view of FIG. 4A.
Figure 4B:
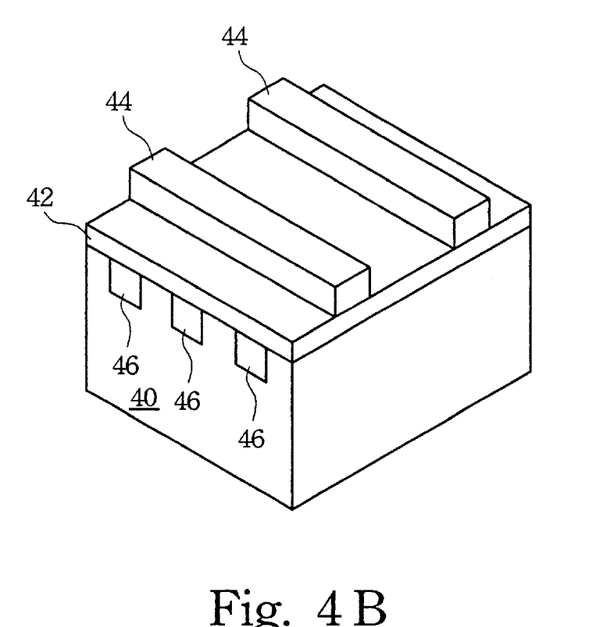

Referring to FIG. 4A, in the first step of the method, a semiconductor substrate 40, such as a P-type silicon substrate, is prepared. Parallel spaced buried bit lines 46 of an impurity type opposite the background impurity type of the substrate, typically formed by N-type dopant such as Arsenic or Phosphorous ion implantation. Therefore, a plurality of the parallel-spaced N+ source/drain regions 46 are formed in the substrate 40, which serve as a plurality of bit lines for the ROM device. The bit line has a spacing typically 0.15 microns and a width typically 0.15 microns. Next, a thin gate oxide layer 42 is formed on the substrate 40. The gate oxide layer had a thickness in the range of 80 to 250 Angstroms. A plurality of parallel spaced polycrystalline silicon word lines 44 are formed over the gate oxide layer 42 that are orthogonal to bit lines 46. The word lines 44 typically have a width 0.15 microns. Layer 44 is typically a conductive layer such as polysilicon and formed by a conventional low pressure chemical vapor deposition (LPCVD). Referring FIG. 4B is the perspective view of FIG. 4A the typically island-like polysilicon layer 44 is parallel-spaced. The channel are formed in the substrate 40 under the word line 44 and located between the adjacent bit lines 46.

Figure 5A:
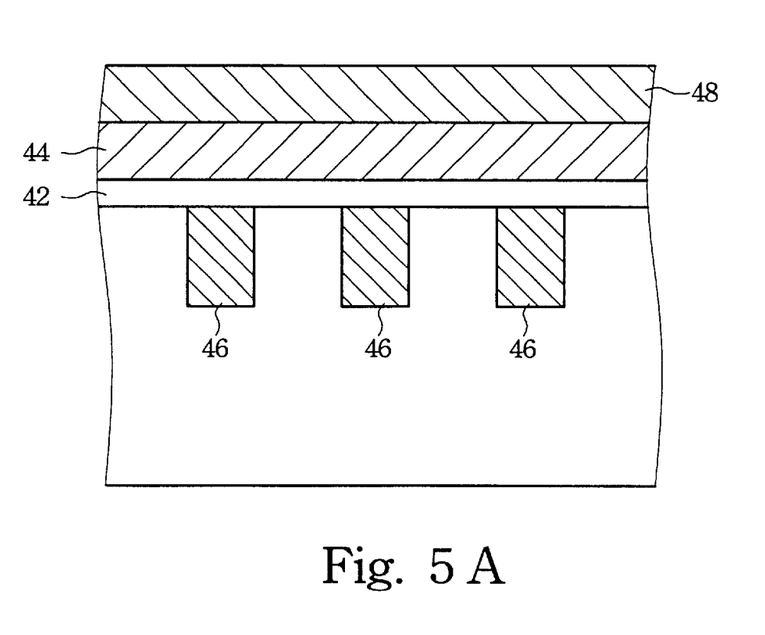
FIG. 5A shows a cross section view of semiconductor substrate illustrating the step of forming a silicon nitride layer on the semiconductor substrate according to the present invention.
Figure 5B:
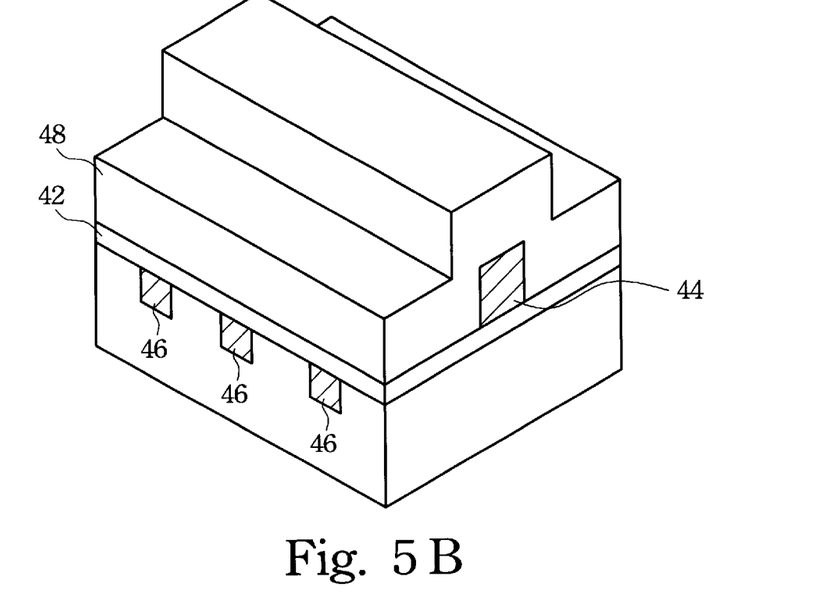
FIG. 5B shows the perspective view of FIG. 5A.

As illustrated in FIG. 5A, the polysilicon layer 44 and the gate oxide layer 42 are covered with a dielectric layer 48. The dielectric layer 48 typically formed of silicon nitride ($Si_3N_4$). FIG. 5B is the perspective view of FIG. 5A. The dielectric layer 48 also can be formed by Oxide, Borophosphosilicate Glass (BPSG), Phosphosilicate Glass (PSG), Borosilicate Glass (B S G), or U S G and so on.

Figure 6A:
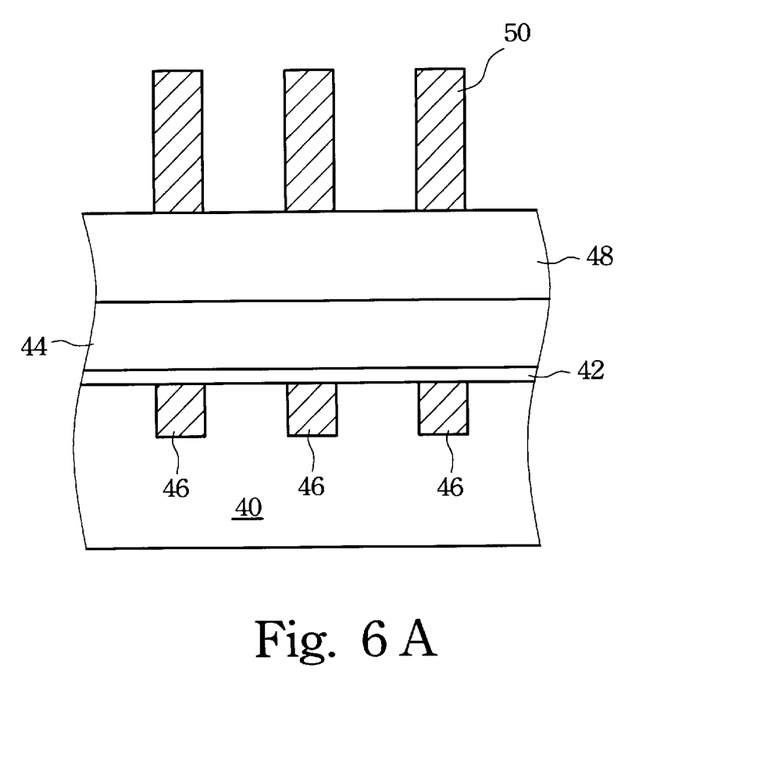
FIG. 6A shows a cross section view of semiconductor substrate illustrating the step of forming a photoresist pattern over the silicon nitride layer according to the present invention.
Figure 6B:
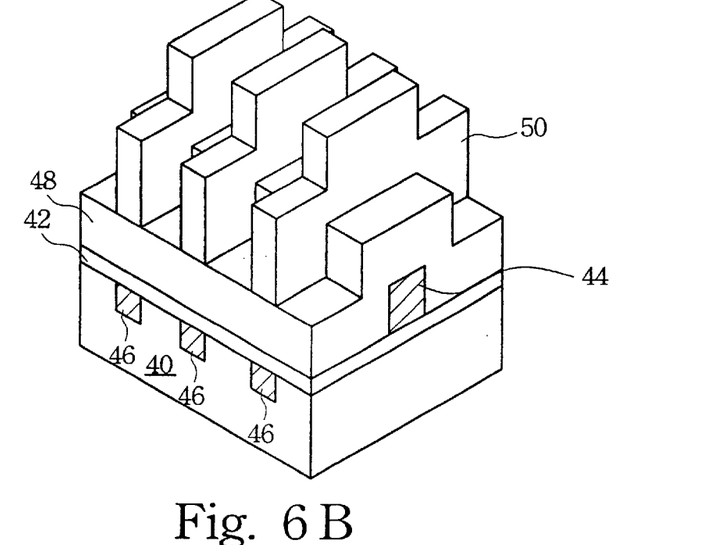
FIG. 6B shows the perspective view of FIG. 6A.

As illustrated in FIG. 6A, a photoresist layer 50 is deposited over the entire silicon nitride layer 48. Then, the proper exposure condition are chosen to selectively remove the photoresist layer 50 and developed those areas of silicon nitride layer 48 required etching process. The exposed area during this step is larger than the code implant area that is only 0.15 um². The resolution difference due to the light refraction is hence not serious, which may exactly expose the etching area. FIG. 6B is the perspective view of FIG. 6A. The photoresist layer 50 is exactly located above the bit lines.

Figure 7A:
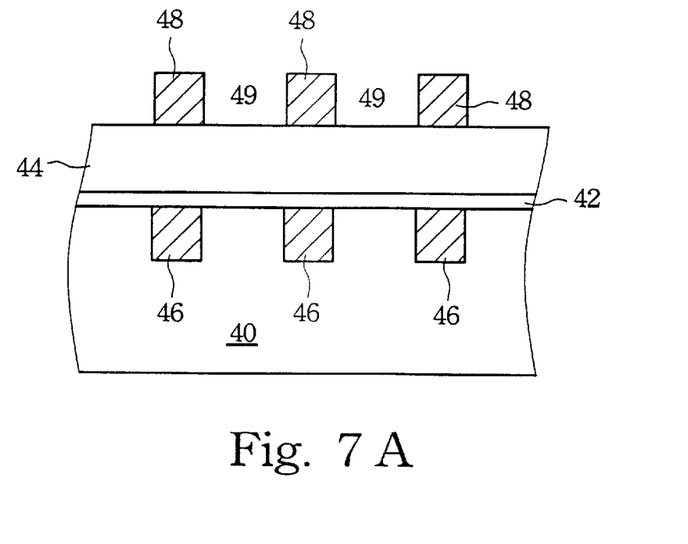
FIG. 7A shows a cross section view of semiconductor substrate illustrating the step of etching the silicon nitride layer and stripping the photoresist layer according to the present invention.
Figures 7B, 7C:
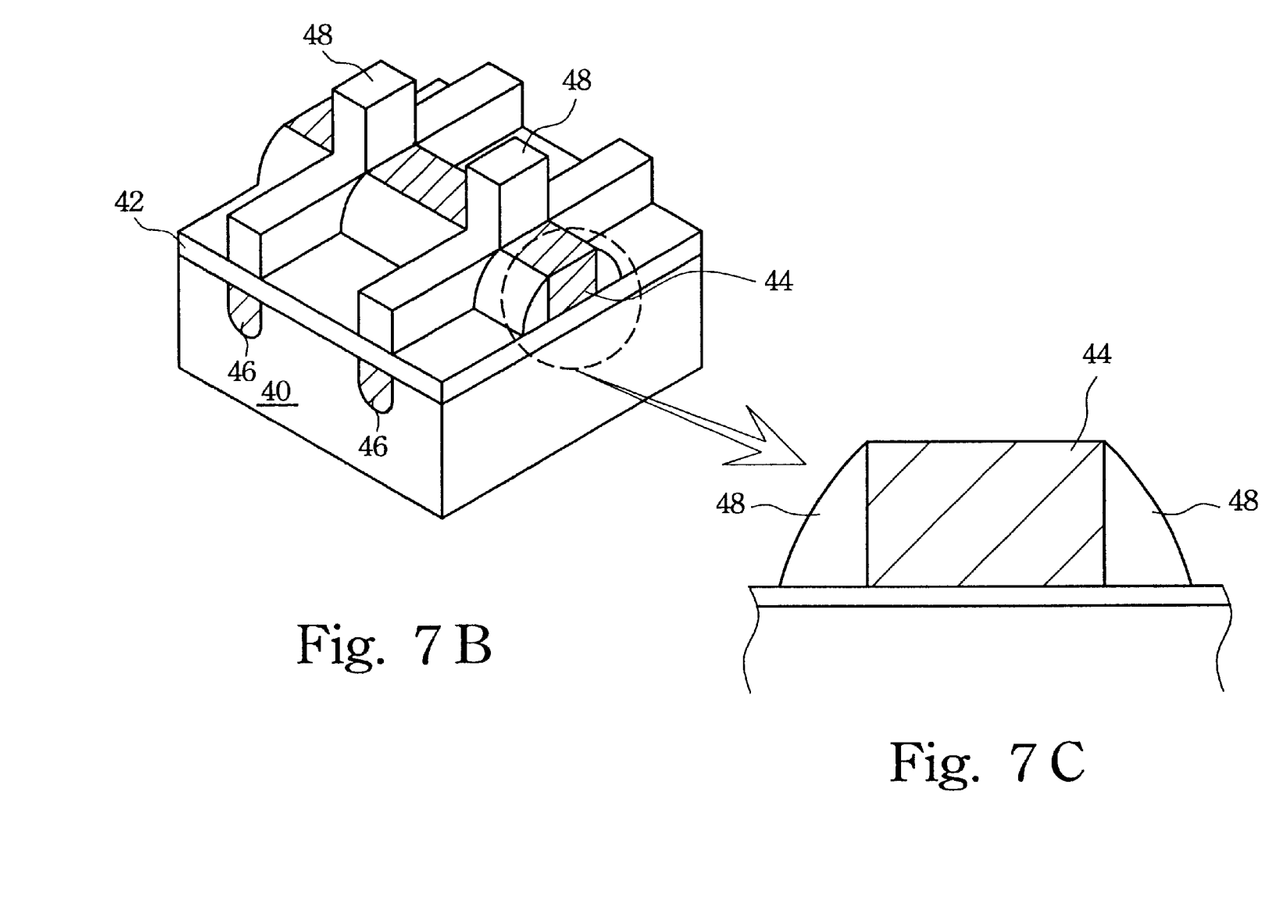
FIG. 7B shows the perspective view of FIG. 7A.
FIG. 7C shows a cross section view of nitride spacer on the side walls of the word lines according to the present invention.

Referring to FIG. 7A, an etching process is performed on the wafer so as to remove the exposed portion of silicon nitride layer 48. As a result of the process, an opening area 49 is formed on the surface of the polysilicon layer 44 and the gate oxide layer 42. FIG. 7B is the perspective view of FIG. 7A. FIG. 7A and FIG. 7B show the device 40 after the photoresist layer 50 has been stripped by a well known conventional technique. Next, and referring o FIG. 7C, nitride spacers 48 are formed on the side walls of the the polysilicon layer 44 by means of forming a silicon nitride layer then etching the layer. Thereafter, nitride spacers 48 are formed by anisotropic etching.

Figure 8:
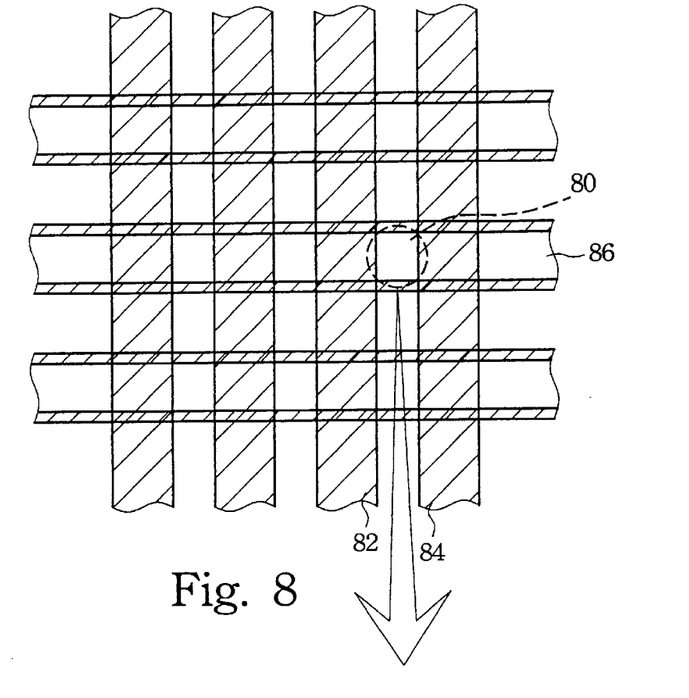
FIG. 8 and FIG. 9 is a top view after the silicon nitride layer has been applied to the Non-volatile ROM according to the present invention.
Figure 9:
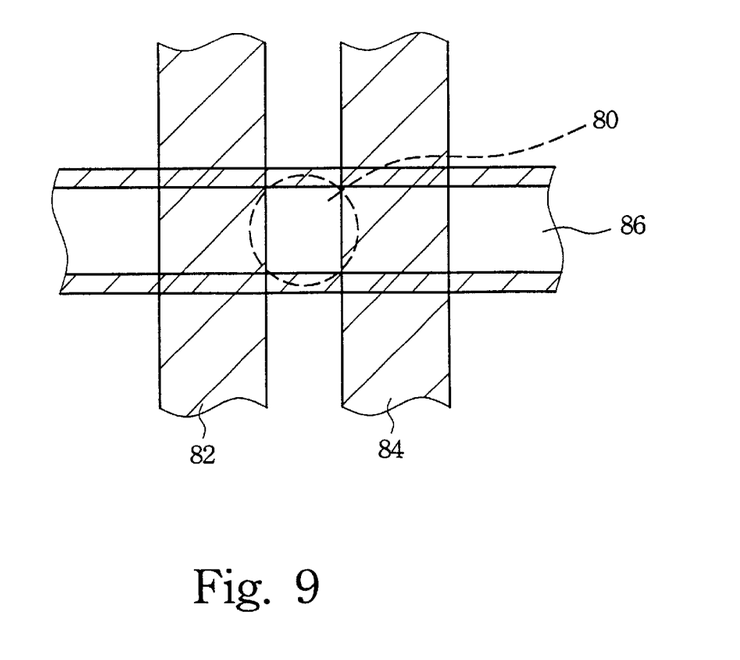

Referring to FIG. 8 and FIG. 9, they show a schematic top view of the device 40 after the silicon nitride layer 48 has been applied to the device 40, wherein the bit lines 46 and some portion of the gate oxide layer 42 are covered by silicon nitride layer and nitride spacer 48. When an ion implantation process is performed on the wafer so as to implant a dopant, such as P-type boron ions, into the channel region indicated by dash circle which is located between the bit line 82 and bit line 84, a photoresist layer is deposited on the surface to pattern the area 80 for code ion implanting. A ROM code mask pattern is selective removed to expose the channel region 80 that are located directly below the word line 86. A code ion implant of boron ions is performed by passing ions through the channel region 80 down through the word line and gate oxide layer into the P substrate. Because code ion implant is boron ions of P-type ion, the channel is N-type. The process of ion implantation will increase the threshold voltage.

The use of silicon nitride layer 48 has two advantages. First, using the process in accordance with this invention, to deposit silicon nitride layer 48 during ion implantation process can eliminate the need for photomask to process optic proximity correction due to the silicon nitride layer providing the buried bit lines protection during ion implantation process. Second, eliminating the overlay even though the area for ion implant is not exactly centered between bit lines. The reason is that the bit lines is covered by a silicon nitride layer, the ion implantation not down through the buried bit lines, therefore the overlay control is easy.

As is understood by a person skilled in the art, the foregoing preferred embodiments of the present invention are illustrated of the present invention rather than limiting of the present invention. It is intended to cover various modifications and similar arrangements included within the spirit and scope of the appended claims, the scope of which should be accorded the broadest interpretation so as to encompass all such modifications and similar structure.

What is claimed is:

1. A method of fabricating a ROM device on a semiconductor substrate with a plurality of parallel buried bit lines, said buried bit lines being oriented in a first direction, a gate oxide layer above the substrate and word lines formed above said gate oxide layer, said word lines being oriented in a second direction, which comprises the steps of:

forming a dielectric layer over said word lines and said gate oxide layer;

forming a first photoresist layer over said dielectric layer;

selectively exposing said first photoresist layer to develop a first opening area over said photoresist layer, said first opening area centered between said adjacent bit lines;

etching said dielectric layer through said first opening area;

stripping said first photoresist layer;

forming a second photoresist layer over said dielectric layer;

selectively exposing said second photoresist layer to develop a second opening area over said second photoresist layer to define a pattern of code ion implantation;

ion implanting a code implant dopant through said second opening area down into said substrate; and stripping said second photoresist layer.

2. The method of claim 1, wherein said semiconductor substrate has a P type background impurity, said bit lines are formed of N type impurity and said ion implantation are P type impurity.

3. The method of claim 1, wherein said semiconductor substrate has a N type background impurity, said bit lines are formed of P type impurity and said ion implantation are N type impurity.

4. The method of claim 1, wherein said dielectric layer comprises a material selected from a group consist of $Si_3N_4$, oxide, BPSG, USG, BSG, FSG and PSG.

5. The method of claim 1, wherein said dielectric layer has a thickness more than 50 Angstroms.

6. The method of claim 1, wherein said first direction and second direction are at right angle.

* * * * *